(12) United States Patent
Oka

(10) Patent No.: US 7,212,049 B2
(45) Date of Patent: May 1, 2007

(54) DIGITAL-CONTROL-TYPE PHASE-COMPOSING CIRCUIT SYSTEM

(75) Inventor: Toshihide Oka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/305,037

(22) Filed: Dec. 19, 2005

(65) Prior Publication Data
US 2006/0232309 A1    Oct. 19, 2006

(30) Foreign Application Priority Data
Apr. 19, 2005   (JP) .............................. 2005-121192

(51) Int. Cl.
*H03L 7/00* (2006.01)
(52) U.S. Cl. ...................................... 327/151; 327/160
(58) Field of Classification Search ................ 327/147, 327/149, 151, 156, 160, 161–163; 331/25; 375/215, 371, 373–376
See application file for complete search history.

(56) References Cited
U.S. PATENT DOCUMENTS 5,485,490 A    1/1996   Leung et al. ................ 375/371
5,487,084 A *  1/1996   Lindholm ..................... 375/215

FOREIGN PATENT DOCUMENTS

JP    2001-217682    8/2001

* cited by examiner

*Primary Examiner*—Linh My Nguyen
(74) *Attorney, Agent, or Firm*—Leydig, Voit & Mayer, Ltd.

(57) ABSTRACT

A digital-control phase-composing circuit system has a phase-composing circuit which is supplied with two input clock signals having a phase difference therebetween and a control signal, and which composes an output clock signal having a phase between the phases of the two input clock signals on the basis of weighting through the control signal, a binary comparison circuit which compares the phase of the output clock signal to the phase of a reference clock signal, a first up/down counter which increments or decrements a first count value on the basis of the result of comparison made by the binary phase comparison circuit, outputs the most significant bit of the first count value, and outputs a clock pulse when a carry or a borrow occurs in the first count value, and a second up/down counter which operates on the basis of the clock pulse as an operating clock, increments or decrements a second count value on the basis of the most significant bit of the first count value, and outputs the second count value as the control signal.

4 Claims, 4 Drawing Sheets i-CLK q-CLK output clock signal reference clock signal phase comparison circuit outputs H
phase comparison circuit outputs L output clock signal

DIGITAL-CONTROL-TYPE PHASE-COMPOSING CIRCUIT SYSTEM

BACKGROUND OF THE INVENTION

1. Field of the Invention

The present invention relates to a digital-control-type phase-composing circuit system in which two clock signals having a phase difference therebetween are weighted through a control signal to compose an output clock signal having a phase between those of the two clock signals. More particularly, the present invention relates to a digital-control-type phase-composing circuit system capable of improving jitter resistance and expanding the lock range.

2. Background Art

In a delay locked loop (DLL) circuit, a digital-control-type phase-composing circuit system which combines two clock signals having a phase difference therebetween by weighting the signals is used (see, for example, Japanese Patent Laid-Open No. 2001-217682 and U.S. Pat. No. 5,485,490).

FIG. 4 is a block diagram showing a conventional digital-control-type phase-composing circuit system. A phase-composing circuit 11 composes an output clock signal having a phase between the phases of two clock signals i-CLK and q-CLK different from each other by weighting these clock signals through a control signal, as shown in FIG. 5. This output clock signal and a reference clock signal (or input data) are input to a flip-flop circuit 12.

A binary phase comparison circuit 13 compares the phase of the output clock signal and the phase of the reference clock signal. An up/down counter 14 increments or decrements the count value on the basis of the result of comparison and outputs the count value as a control signal to the phase-composing circuit 11. Thus, feedback to the control signal is provided such that the phase of the output clock signal is equalized to the phase of the reference clock signal, thereby locking the output clock signal to the reference clock signal.

However, if the operating frequency of the counter is reduced to improve the jitter resistance of the phase-composing circuit, the lock range is reduced. Conversely, if the operating frequency of the counter is increased to expand the lock range, the phase-composing circuit is easily affected by high-frequency jitter when the reference clock signal and the output clock signal become in phase with each other.

Also, in a situation where the reference clock signal and the output clock signal are in a positional relationship shown in FIG. 6, the phase comparison circuit may output low level (L) when it should output high level (H), if the edge of the reference clock signal fluctuates due to jitter. If the reference clock signal has such jitter, the output clock signal from the phase comparison circuit is fluctuated by the jitter so that the value of the up/down counter in the following stage is changed unnecessarily frequently, thus causing jitter in the output clock signal. For this reason, it is difficult to apply the conventional digital-control-type phase-composing circuit system particularly to a clock and data recovery (CDR) circuit which processes data containing a large amount of jitter.

SUMMARY OF THE INVENTION

In view of the above-described problems, an object of the present invention is to provide a digital-control-type phase-composing circuit system capable of improving jitter resistance and expanding the lock range.

According to one aspect of the present invention, a digital-control-type phase-composing circuit system has a phase-composing circuit which is supplied with two input clock signals having a phase difference therebetween and a control signal, and which composes an output clock signal having a phase between the phases of the two input clock signals on the basis of weighting through the control signal, a binary comparison circuit which compares the phase of the output clock signal and the phase of a reference clock signal, a first up/down counter which increments or decrements a first count value on the basis of the result of comparison made by the binary phase comparison circuit, outputs the value of the most significant bit of the first count value, and outputs a clock pulse when a carry or a borrow occurs in the first count value, and a second up/down counter which operates on the basis of the clock pulse used an operating clock, increments or decrements a second count value on the basis of the most significant bit of the first count value, and outputs the second count value as the control signal.

Other and further objects, features and advantages of the invention will appear more fully from the following description.

According to the present invention, the jitter resistance can be improved and the lock range can be expanded.

DETAILED DESCRIPTION OF THE PREFERRED EMBODIMENTS

Figure 1:
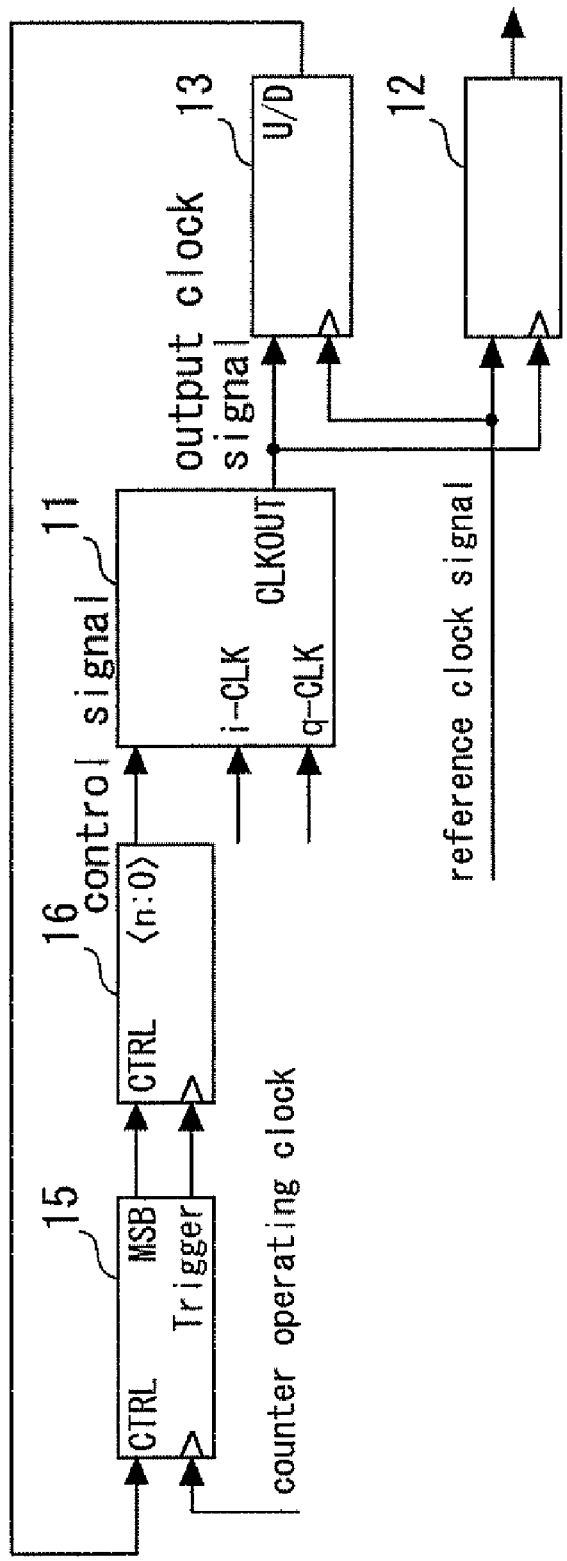
FIG. 1 is a block diagram showing a digital-control-type phase-composing circuit system according to an embodiment of the present invention.

FIG. 1 is a block diagram showing a digital-control-type phase-composing circuit system according to an embodiment of the present invention. This system has a phase-composing circuit 11, a flip-flop circuit 12 and a binary phase comparison circuit 13, as does the conventional system. This system, however, has a first up/down counter 15 and a second up/down counter 16 in place of the up/down counter of the conventional system.

The phase-composing circuit 11 is supplied with two clock signals i-CLK and q-CLK differing in phase from each other, and a control signal. An output clock signal having a phase between the phases of the two input clock signals is composed on the basis of weighting through this control signal. This output clock signal and a reference clock signal are input to the flip-flop circuit 12.

The binary phase comparison circuit 13 compares the phase of the output clock signal and the phase of the reference clock signal. The binary phase comparison circuit 13 has the same configuration as that of the flip-flop circuit 12 (D-type flip-flop) but the reference clock signal and the output clock signal input to the binary phase comparison circuit 13 are replaced with each other in comparison with those input to the flip-flop circuit 12.

The first up/down counter 15 operates on the basis of a counter operating clock, increments or decrements a first count value on the basis of the result of comparison performed by the binary phase comparison circuit 13, and outputs the value MSB of the most significant bit of the first count value. When a carry or a borrow occurs in the first count value, the first up/down counter 15 outputs a clock pulse trigger and returns the count value to a central count value.

The second up/down counter 16 operates on the basis of the clock pulse trigger used an operating clock, increments or decrements a second count value on the basis of the value MSB of the most significant bit of the first count value, and outputs the second count value as a control signal for control of the phase-composing circuit 11.

Figure 2:
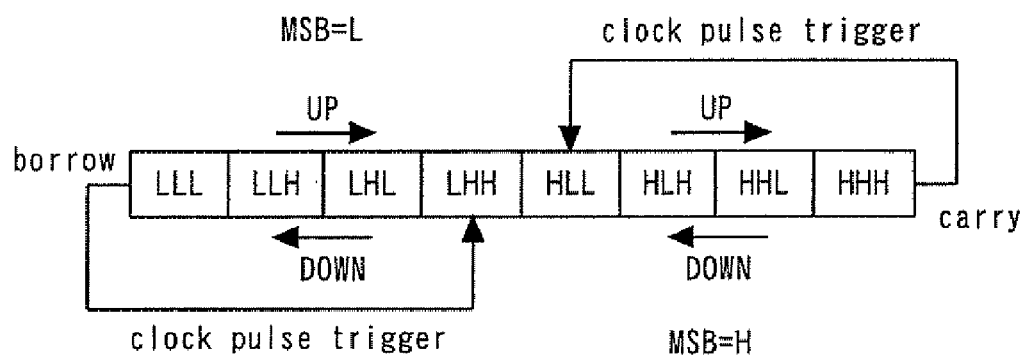
FIG. 2 shows is a diagram showing the first count value of the first up/down counter.

The operation of the above-described system will be described with reference to FIG. 2. FIG. 2 is a diagram showing the first count value of the first up/down counter 15. It is assumed here that the bit length of the first count value is 3 and that the initial value of the first up/down counter 15 is set to the central value of the first count value.

When the output from the binary phase comparison circuit 13 is high rich, the occurrence of increment of the first up/down counter 15 is increased. Incrementing the first count value from the central value four times ($2^{n-1}$ times if the bit length of the first count value is n) causes a carry (taking a figure up one place) to generate a clock pulse. When the output from the binary phase comparison circuit 13 is low rich, the occurrence of decrement of the first up/down counter 15 is increased. Decrementing the first count value from the central value four times causes a borrow (taking a figure down one place) to generate a clock pulse.

In synchronization with the clock pulse output from the first up/down counter 15, the second up/down counter 16 increments the second count value if the value MSB of the most significant bit of the first count value is H, and decrements the second count value if the value MSB of the most significant bit of the first count value is L. The second up/down counter 16 outputs the second count value as the control signal to the phase-composing circuit 11. When this control signal is changed, the phase of the output clock signal from the phase-composing circuit 11 is changed.

As the phase of the output clock signal and the phase of the reference clock are gradually made closer to each other in the above-described way to be equalized, the frequency of change of the output from the binary phase comparison circuit 13 between H and L is increased. Simultaneously, in the first up/down counter 15, the number of times increment is performed and the number of times decrement is performed are equalized to reduce the chance of outputting the clock pulse. As a result, the control signal output from the second up/down counter 16 stops changing and the phase of the output clock signal from the phase-composing circuit 11 is fixed.

The conventional system is easily affected by high-frequency jitter when the reference clock signal and the output clock signal become in phase with each other, if the operating frequency of the counter is increased to expand the lock range. In contrast, in the system of the present invention, the operating frequency of the second up/down counter 16 is automatically adjusted according to the phase difference condition and the output of the binary phase comparison circuit 13 is thereby smoothed and is thereafter fed back as a control signal for control of the phase-combining circuit 11, so that the effective operating frequency of the counter is reduced when phase equalization is completed. Therefore, the influence of high-frequency jitter can be suppressed. Also, the arrangement has the effect of immediately reducing jitter in the output clock signal. Consequently, the system of the present invention is capable of improving the jitter resistance and expanding the lock range.

The system may be constructed so that a plurality of counter operating clock signals differing in frequency from each other are prepared; up/down counters having different first count value bit lengths are prepared as the first up/down counter 15; and one of the clock signals and one of the counters can be selected, thereby making it possible to change the speed of change of the phase of the output clock signal by changing the operating frequency of the first up/down counter or changing the bit length of the first count value. More specifically, if the counter operating frequency is lower, or if the bit length of the first count value is longer, jitter of a higher frequency can be suppressed.

Figure 3:
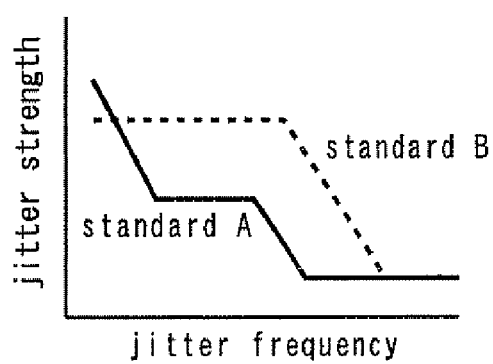
FIG. 3 shows the relationship between the jitter frequency and the jitter strength.
Figure 4:
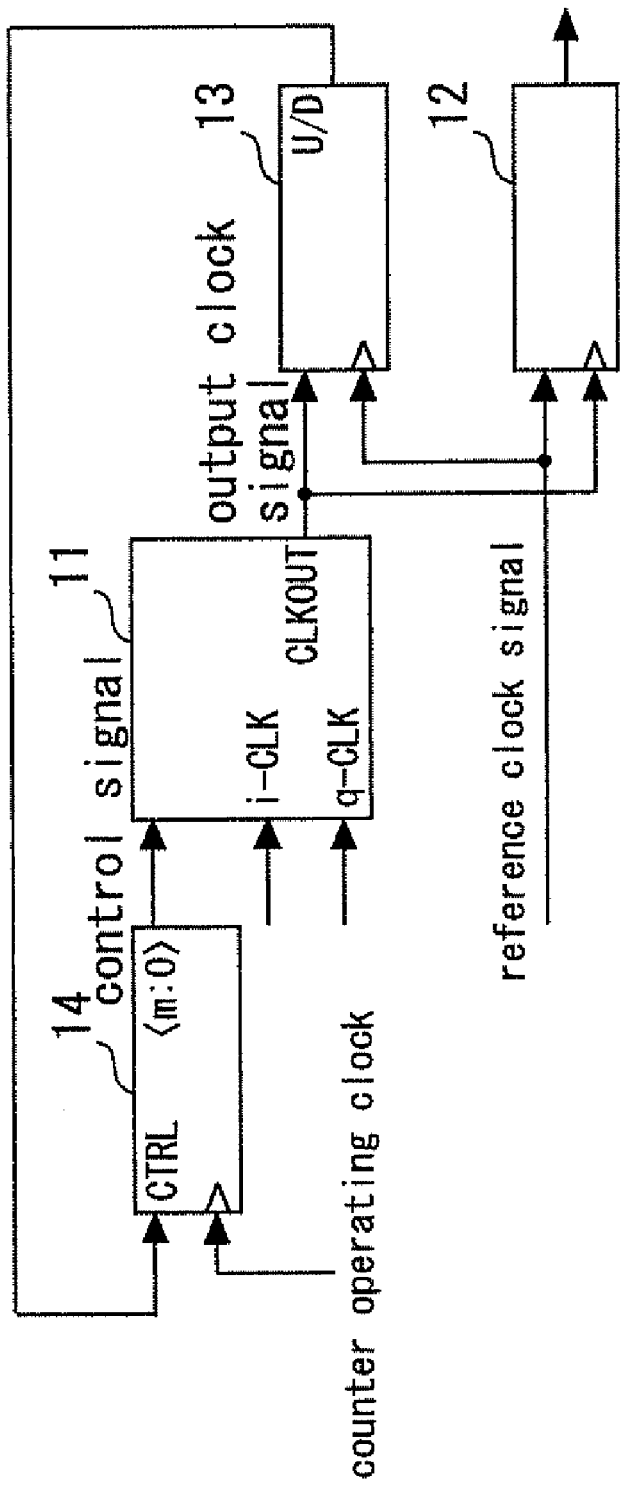
FIG. 4 is a block diagram showing a conventional digital-control-type phase-composing circuit system.
Figure 5A:
FIGS. 5A–5C show the timing chart of the input and output clock signals of the phase-composing circuit.
Figure 5B:
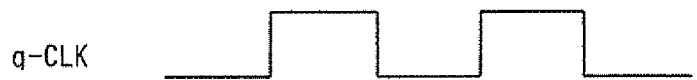
Figure 5C:
Figure 6A:
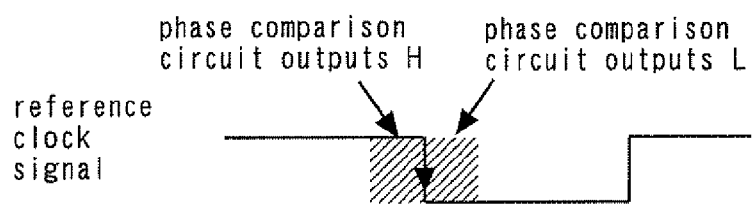
FIGS. 6A and 6B show the timing chart of the reference clock signal and the output clock signal.
Figure 6B:

Therefore, the same circuit can conform to a plurality of jitter resistance standards. For example, when the relationship between the jitter frequency and the jitter strength is changed from a standard B to a standard A shown in FIG. 3, the lower counter operating frequency is selected in the circuit conforming to the standard B or the first up/down counter 15 having the longer first count value bit length is selected, thereby conforming the circuit to the standard A.

If the initial value of the first up/down counter 15 is set to the central value of the first count value, the output clock signal is locked in correspondence with making the reference clock signal and the output clock signal completely in phase with each other. The phase of the output clock signal at the time of locking can be changed by shifting the initial value toward one limit of the first count value. In this way, a timing design having an optimum setup/hold margin for the flip-flop circuit 12 can be made.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-121192, filed on Apr. 19, 2005 including specification, claims, drawings and summary, on which the Convention priority of the present application is based, are incorporated herein by reference in its entirety.

What is claimed is:

1. A digital-control phase-composing circuit system comprising:

a phase-composing circuit which is supplied with two input clock signals having a phase difference therebetween and a control signal, and which composes an output clock signal having a phase difference between the phases of the two input clock signals, based on weighting through the control signal;

a binary comparison circuit which compares the phase of the output clock signal to the phase of a reference clock signal;

a first up/down counter which increments or decrements a first count value based on results of the comparison made by the binary phase comparison circuit, outputs the most significant bit of the first count value, and outputs a clock pulse when a carry or a borrow occurs in the first count value; and a second up/down counter which uses the clock pulse as an operating clock, increments or decrements a second count value based on the most significant bit of the first count value, and outputs the second count value as the control signal.

2. The digital-control phase-composing circuit system according to claim 1, wherein bit length of the first counter is variable.

3. The digital-control phase-composing circuit system according to claim 1, wherein operating frequency of the first counter is variable.

4. The digital-control phase-composing circuit system according to claim 1, wherein initial value of the first count value is variable.

* * * * *